(12) United States Patent
Mori (10) Patent No.: US 6,417,083 B1
(45) Date of Patent: Jul. 9, 2002

(54) METHODS FOR MANUFACTURING SEMICONDUCTOR DEVICES

(75) Inventor: Katsumi Mori, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/438,164

(22) Filed: Nov. 11, 1999

(30) Foreign Application Priority Data

Nov. 13, 1998 (JP) ............................................. 10-341105
Sep. 6, 1999 (JP) ............................................. 11-251218

(51) Int. Cl.⁷ ........................................ H01L 21/3205
(52) U.S. Cl. ........................ 438/585; 438/197; 438/595
(58) Field of Search ................................. 438/143, 197, 438/585, 586, 587, 595

(56) References Cited

U.S. PATENT DOCUMENTS

| 5,017,513 A | | 5/1991 | Takeuchi ..................... 437/228 |
| 5,728,508 A | * | 3/1998 | Takemura et al. |
| 5,920,796 A | | 7/1999 | Wang et al. ................. 438/700 |
| 6,004,722 A | * | 12/1999 | Zhang et al. |
| 6,004,853 A | | 12/1999 | Yang et al. .................. 438/305 |
| 6,046,114 A | | 4/2000 | Tohda ......................... 438/695 |
| 6,136,676 A | * | 10/2000 | Saito ........................... 438/587 |

FOREIGN PATENT DOCUMENTS

| EP | 605123 | * | 1/1998 |
| EP | 820093 | * | 1/1998 |
| JP | 5-304167 | | 11/1993 |
| JP | 6-020943 | | 1/1994 |
| JP | 7-335869 | | 12/1995 |
| JP | 8-153704 | | 6/1998 |
| JP | 10-242117 | | 9/1998 |
| JP | 10-303183 | | 11/1998 |
| JP | 2000-31018 | | 1/2000 |

OTHER PUBLICATIONS

Ta et al., "A sub-half micron deep-UV integrated ARC process", Proc. Electrochem. Soc. (1992), 92–18, pp 460–471.*
U.S. Application Serial No. 09/438,166, docket No. 0010–0008, filed Nov. 11, 1999.
Translation of "Notice of Grounds for Rejection" re: Japanese 1999 Patent Application 251217, date of notice Apr. 4, 2001.

* cited by examiner

Primary Examiner—Trung Dang
(74) Attorney, Agent, or Firm—Konrad Raynes Victor & Mann, LLP; Alan S. Raynes (57) ABSTRACT

Certain embodiments provide a manufacturing method for a semiconductor device, in which an organic antireflection film can be etched while a resist layer maintains dimensions thereof. The method includes forming an oxide layer 24 on a p-type silicon substrate 10, and forming a polysilicon layer 26 on the oxide layer 24. An organic antireflection film 30 is formed on the polysilicon layer 26, and a resist layer R having a predetermined pattern is formed on a surface of the organic antireflection film 30. The method as includes etching the organic antireflection film 30 by using the resist layer R, in which an etching gas includes at least one of an oxygen-based gas and a chlorine-based gas, and forming a gate electrode by etching the polysilicon layer 26 with a predetermined pattern.

20 Claims, 6 Drawing Sheets

METHODS FOR MANUFACTURING SEMICONDUCTOR DEVICES

FIELD OF THE INVENTION

The present invention relates to semiconductor devices and methods for their manufacture, and more particularly, certain embodiments relate to etching of a conductive layer containing silicon.

BACKGROUND

Figure 10:
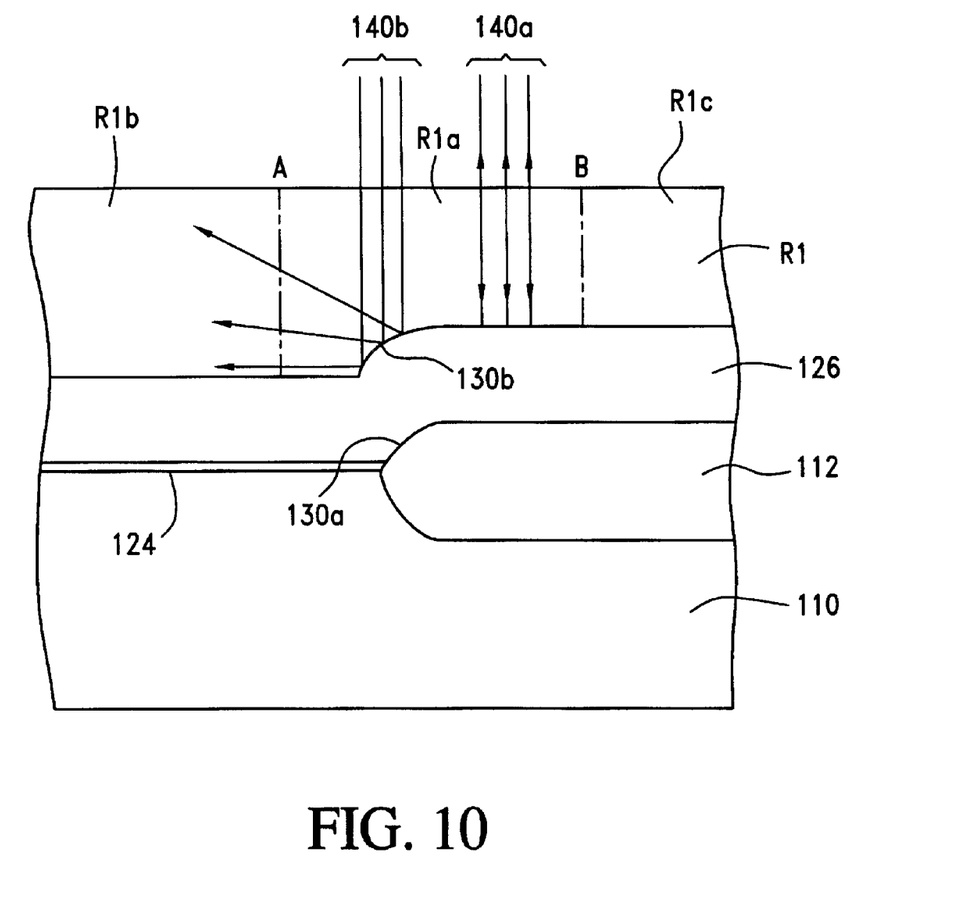
FIG. 10 is a schematic cross-sectional view showing a state of exposing light when a resist layer formed on a polysilicon layer has a step.
Figure 11:
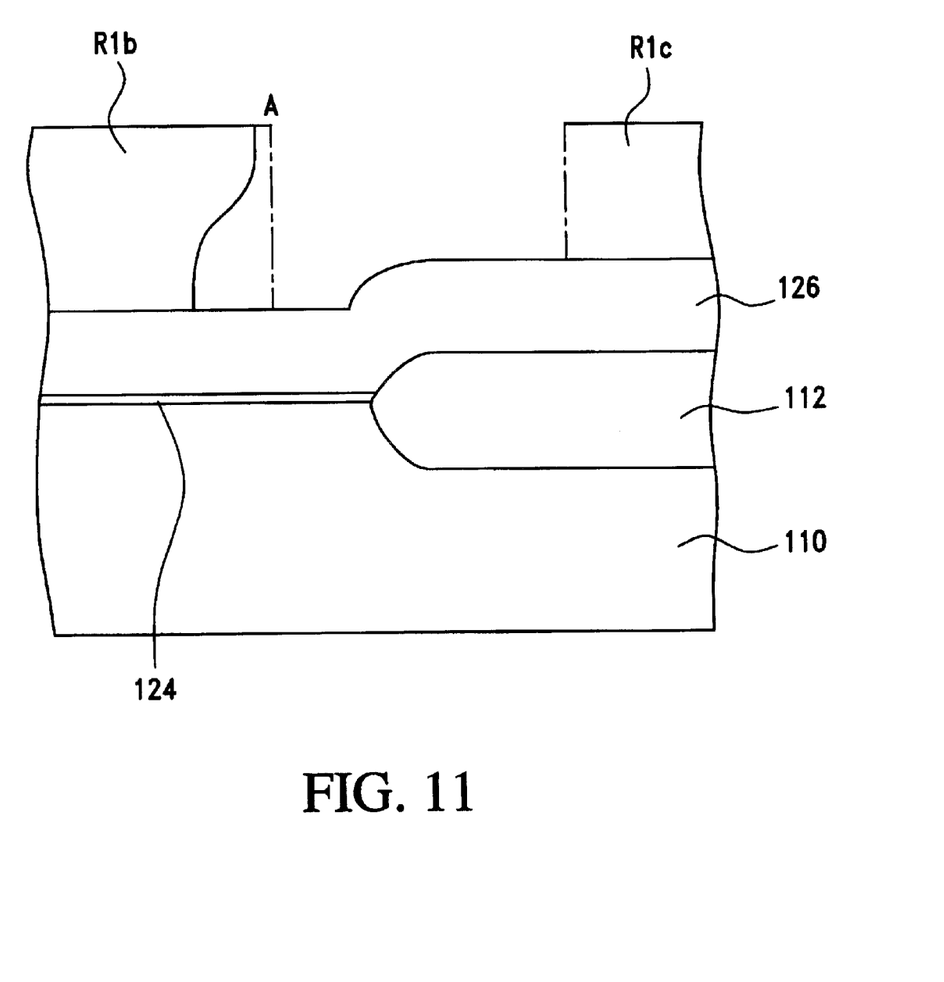
FIG. 11 is a schematic view showing a remaining resist layer after development of the resist layer shown in FIG. 10.

In a method for manufacturing a semiconductor device, formation of a gate electrode, for example, is performed by etching a part of a conductive layer such as a polysilicon layer formed on a semiconductor substrate through a dielectric layer. The etching is performed by a photolithographic method by using a desired resist pattern for obtaining desired shapes and dimensions. Accordingly, to obtain a desired photo pattern is an important technology for formation of gate electrodes. However, with recent reduction in size of gate electrode structures, the following phenomenon occurs at steps of edges of an element isolation region when a resist is subjected to an exposure. Referring to FIGS. 10 and 11, the phenomena will be explained.

FIG. 10 is a cross-sectional view when a gate electrode is formed adjacent to an element isolation region of a semiconductor device. A first step 130a exists at an edge near a gate oxide film 124 of an element isolation region 112 formed on a silicon substrate 110. When a polysilicon layer 126 is deposited on the element isolation region 112 and the gate oxide film 124, a second step 130b is created on the polysilicon layer 126 located over the first step 130a. When the second step 130b exists, for example, the following problem occurs.

For etching a predetermined pattern in the polysilicon layer 126, dry etching is performed by the use of a mask having a pattern generally formed by a resist. A patterning of the resist is performed by exposing and developing the resist. Accordingly, when a region indicated by the chained lines between A and B in a resist layer R1 shown in FIG. 10 is removed, only the resist layer region R1a need be exposed in the case of using a positive resist. When the resist layer region R1a indicated by the chained lines between A and B is exposed, exposure light penetrates through the resist layer region R1a and is reflected at an interface between the resist layer R1 and the polysilicon layer 126. Therefore, reflected light at a horizontal portion of a surface of the polysilicon layer 126, such as a first exposure light 140a, advances in a direction opposite to that of the incident light. While reflected light at the second step 130b, such as a second exposure light 140b, advances in various directions corresponding to tilting angles of the second step 130b, the incident light penetrates and exposes the resist layer R1b which is designed to remain. When the above is developed, the remaining resist layer R1b has a chipped edge, as shown in FIG. 11, so that good patterning of the resist layer cannot be obtained.

To overcome the problem described above, in Japanese Unexamined Patent Application Publication No. 8-153704, a technology for disposing an organic antireflection film between a polysilicon layer 126 and a resist layer R1 is proposed. By disposing the antireflection film mentioned above, exposure light which penetrates the antireflection film is absorbed and does not reflect at an interface between the resist layer and the antireflection film, so that a resist mask having desired dimensions and shapes can be obtained.

However, the organic antireflection film as described above is not removed when the resist mask is formed, and it remains on the polysilicon layer. Hence, for etching the polysilicon layer by using a resist mask, the organic antireflection film is required to be etched in desired dimensions and shapes by using a resist mask.

Accordingly, for forming a gate electrode by the use of an organic antireflection film and a resist mask prepared by a photolithographic method, two etching methods are used. One etching method is to have the organic antireflection film provided with controlled dimensions and shapes by the use of a resist mask; the other etching method is to have the gate electrode provided with controlled dimensions and shapes by the use of the mask composed of the resist and the antireflection film.

SUMMARY

One embodiment relates to a method for manufacturing a semiconductor device including forming a dielectric film on a semiconductor substrate and forming a conductive film containing silicon on the dielectric film. An organic antireflection film is formed on the conductive film and a resist layer having a predetermined pattern is formed on the organic antireflection film. The method also includes etching the organic antireflection film using the resist layer as a mask, using an etching gas that includes at least one of an oxygen-based gas and a chlorine-based gas. A gate electrode is formed by etching the conductive layer with a predetermined pattern.

Another embodiment relates to a method for fabricating a semiconductor device including forming a dielectric film on a semiconductor substrate and a conductive film on the dielectric film. The method also includes forming an organic antireflection film on the conductive film and forming a resist layer having a predetermined pattern on the organic antireflection film. The organic antireflection film is etched using the resist layer as a mask, using an etching gas that includes at least one of an oxygen-based gas and a chlorine-based gas. The conductive layer is etched with a predetermined pattern.

Another embodiment relates to a method for fabricating a semiconductor device including forming a conductive film containing silicon over a dielectric layer and forming an organic antireflection film on the conductive film. A resist layer having a predetermined pattern is formed on the organic antireflection film. The method also includes etching the organic antireflection film using the resist layer as a mask, using an etching gas including an oxygen-based gas and a chlorine-based gas. The method also includes etching conductive layer with a predetermined pattern.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

One object of certain embodiments of the present invention is to provide a method for manufacturing a semiconductor device, which is capable of etching an antireflection film while maintaining dimensions and shapes of a resist layer.

A method for manufacturing a semiconductor device according to certain embodiments of the present invention includes the following steps (a) to (f):

(a) forming a dielectric film on a semiconductor substrate;

(b) forming a conductive film containing silicon on the dielectric film;

(c) forming an organic antireflection film on the conductive film;

(d) forming a resist layer having a predetermined pattern on the organic antireflection film;

(e) etching the organic antireflection film by using the resist layer as a mask, in which an etching gas includes at least one of an oxygen-base gas and a chlorine-based gas; and (f) forming a gate electrode by etching the conductive layer by the use of a predetermined pattern.

The organic antireflection film is a film preferably composed of an organic material as a main component, in which a light reflectance for a predetermined wavelength is not more than 5%.

According to the study by the inventors of the present invention, control of dimensions and shapes of an antireflection film in etching was found to be quite difficult. Since a material composing a resist mask is typically similar to a material composing an antireflection film, the resist layer as a mask is etched during etching of the antireflection film, so that dimensions and shapes are easily changed.

The etching gas used for etching the antireflection film in step (e) preferably includes at least one of an oxygen-based gas and a chlorine-based gas for the following reason.

The antireflection film composed of an organic material readily reacts with oxygen. Therefore, in the etching of the antireflection film, oxygen is generally used as an etching gas. A plasma dry etching using oxygen, by virtue of less physical damage that generally occurs in any plasma dry etching process, can etch the antireflection film very effectively. However, when the antireflection film is etched by using the resist layer as a mask, the resist layer is etched during an etching of the antireflection film when only an oxygen-based gas is used because the resist layer is also composed of an organic material similar to that of the antireflection film. Since the etching of the resist layer generally proceeds in an isotropic manner, the dimensions thereof differ before and after the etching. However, chlorine ions in plasma, which are incorporated in chlorine-based gas, react with the carbon constituting the resist layer and the organic antireflection film, so that a reaction product is formed on side walls of the resist layer as a protection film. The formation of the protection film may be balanced with the etching by oxygen ions in plasma, so that the etching of the resist layer in the lateral direction does not proceed. Consequently, only the organic antireflection film can be selectively etched without changing the dimensions of the resist layer.

When the etching gas includes an oxygen-based gas and a chlorine-based gas, a ratio of the number of chlorine atoms to the number of oxygen atoms (number of chlorine atoms/ number of oxygen atoms) (hereinafter referred to as the "mole ratio") is preferably 0.5 to 5. When the mole ratio is less than 0.5, the plasma is rich with oxygen ions and oxygen radicals, and the etching amount is greater than that of the protection film formed by reaction product between chlorine and carbon, so that dimensions of the resist mask tends to be thin. For easily etching the organic antireflection layer, oxygen ions and oxygen radicals are made to readily advance toward the substrate, and not toward the side wall of the resist; the reaction rate at the substrate side is therefore faster. Consequently, a mole ratio not less than 0.5 may be satisfactory. In contrast, when the mole ratio is greater than 5, the plasma is rich with chlorine ions, which is the opposite of the condition described above, and the protection film formed on the side walls of the resist layer becomes too thick, so that the width thereof becomes thick. As a result, a gate electrode having desired dimensions may be difficult to form.

The chlorine-based gas preferably includes at least one gas selected from the group consisting of $Cl_2$, $CCl_4$, HCl, and $BCl_3$. These chlorine-based gases may form superior protection films. The oxygen-based gases preferably include at least one gas selected from the group consisting of oxygen, ozone, and carbon monoxide. These oxygen-based gases may be capable of preferably etching the organic antireflection layer.

The etching gas in step (e) may include at least one element selected from the group consisting of argon, helium, and nitrogen.

The etching in step (e) may be performed by dry etching.

The pressure for etching (hereinafter referred to as the "etching pressure") in step (e) is preferably 1 to 10 mTorr. When the etching pressure is less than 1 mTorr, plasma stability is difficult to maintain. In contrast, when the etching pressure is greater than 10 mTorr, isotropic plasma etching becomes dominant and the protection film formed on the side walls of the resist layer becomes too thick, so that the width of the resist layer is changed. As a result, a gate electrode having desired dimensions may be difficult to form.

The etching in step (e) is preferably performed by high density plasma etching which easily generates stable plasma in the range of 1 to 10 mTorr. A "high density plasma" is one having ion density not less than about $1 \times 10^{11}$ $cm^{-3}$.

Step (e) and step (f) may be performed continuously.

Preferred embodiments according to the present invention will be explained with reference to the drawings. A manufacturing process for a semiconductor device 100 shown in FIG. 6 will be explained. FIGS. 1 to 6 show manufacturing steps for the semiconductor device 100.

Figure 1:
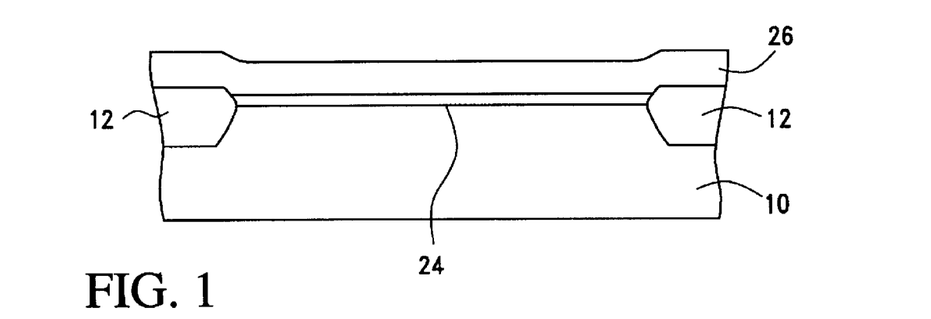
FIG. 1 is a schematic cross-sectional view showing a step of a manufacturing method for a semiconductor device according to an embodiment.

Referring to FIG. 1, an explanation will be made. An element isolation region 12 composed of a silicon oxide film is formed by a known method on a predetermined surface of a p-type silicon substrate 10. Then, an oxide film 24 is formed on an element region defined by the element isolation region 12. A part of the oxide film 24 is to be used as a gate oxide film 16. A thickness of the oxide film 24 that depends on a desired element characteristic is, for example, 30 to 80 angstroms (3 to 8 run). A polysilicon layer 26 is formed on the element isolation region 12 and on the oxide film 24 by a chemical vapor deposition (CVD) method or the like. The polysilicon layer 26 has low resistance due to impurities doped therein. A part of the polysilicon layer 26 is used as a gate electrode 18.

Figure 2:
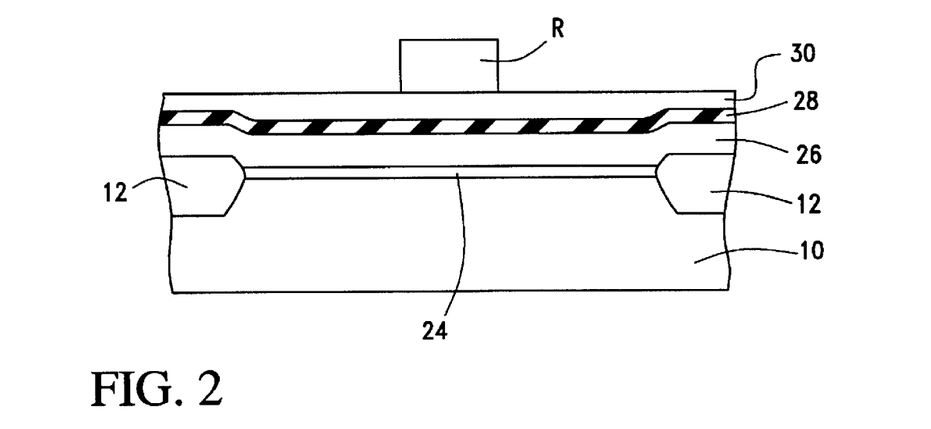
FIG. 2 is a schematic cross-sectional view showing a step of a manufacturing method for a semiconductor device according to an embodiment.

Referring to FIG. 2, a manufacturing step will be explained. A stop layer 28 is formed on the surface of the polysilicon layer 26. A material composing the stop layer 28, may be, for example, preferably silicon oxide, or another material such as, for example, silicon nitride, titanium nitride, titanium, and tungsten. A function of the stop layer 28 will be explained later. A thickness of the stop layer 28, which is not limited so long as the functioning thereof is good, is preferably 10 to 100 angstroms (1 to 10 run). When the thickness of the stop layer 28 is not less than 10 angstroms (1 nm), more reliable functioning of the stop layer 28 is ensured. The reason the thickness of the stop layer 28 is preferably not greater than 100 angstroms (10 nm) will be explained later. A method for forming the stop layer 28 is not limited; a CVD method or the like may be recommended from the point of view of simplicity and good controllability thereof. When the stop layer 28 is composed of silicon oxide, a method of oxygen plasma processing, thermal oxidation, or the like may be employed.

An organic antireflection film 30 having a preferred thickness of 500 to 1500 amgstroms (50 to 150 nm) is formed on the stop layer 28. The organic antireflection film 30 is preferably a film which is composed of an organic material as a main component and has a light reflectance of not more than 5% for a predetermined wavelength, and more preferably not more than 3%. The organic antireflection film 30 is formed by a method such as spin coating, and the thickness thereof is optimized by reflectance of a ground layer and/or desired resist dimensions. The organic antireflection layer 30 is composed of an organic polymer resin and one or more additives, similar to a resist material.

A photoresist is coated on the organic antireflection film 30. Then, the photoresist is patterned by a photolithographic method. Thus, as shown in FIG. 2, the resist layer R provided with a predetermined pattern is formed.

Figure 3:
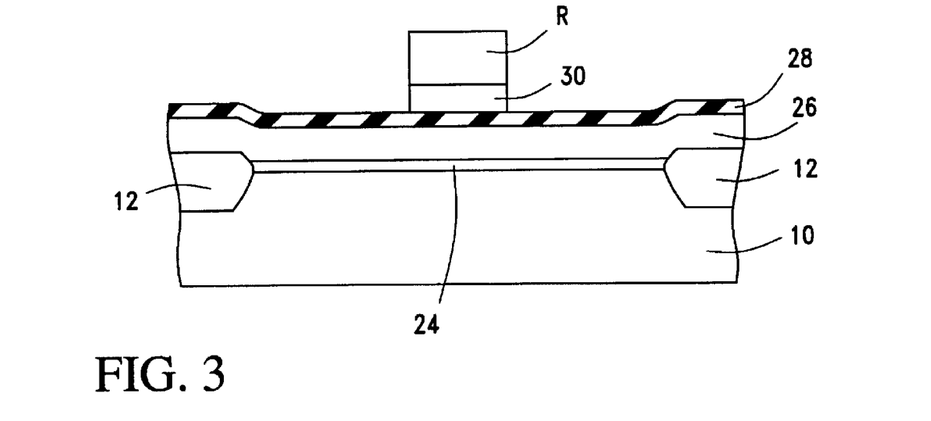
FIG. 3 is a schematic cross-sectional view showing a step of a manufacturing method for a semiconductor device according to an embodiment.

Next, as shown in FIG. 3, the organic antireflection film 30 is etched by using the resist layer R as a mask. The etching may be performed by dry etching, and is preferably performed by high density plasma etching. The high density plasma is plasma having ion density of not less than about $1 \times 10^{11}$ cm$^3$.

In the embodiment, the stop layer 28 is formed on the surface of the polysilicon layer 26. The stop layer 28 may perform the following function when the organic antireflection film is etched. When the organic antireflection film 30 disposed on the surface of the polysilicon layer 26 is etched by using the resist layer R as a mask, etching defects in the form of pinholes on the upper part of the polysilicon layer 26 adjacent to the resist layer R may be generated in some cases. However, by disposing the stop layer 28 between the organic antireflection film 30 and the polysilicon layer 26, the polysilicon layer 26 is inhibited from contacting an etching gas for etching the organic antireflection film 30. Consequently, when the organic antireflection film 30 is etched, generation of the etching defects in the form of pinholes on the upper part of the polysilicon layer 26 is inhibited.

A preferable etching for etching the organic antireflection film 30 is high density plasma etching and is preferably performed under the following conditions.

Plasma etching gases are not limited; a mixture of a chlorine-based gas and an oxygen-based gas is preferable. The chlorine-based gases may include, for example, $Cl_2$, $CCl_4$, HCl, and $BCl_3$. The oxygen-based gases may include, for example, oxygen, ozone, and carbon monoxide.

Since the plasma etching gas is preferably a mixture of a chlorine-based gas and an oxygen-based gas, the resist layer is not substantially etched and only the organic antireflection film 30 can be selectively etched. The reason for this is described below.

The organic antireflection film 30 includes an organic material. Hence, by using an oxygen-based gas, the organic antireflection film 30 can be removed by etching. The resist layer R also includes an organic material, similar to the organic antireflection film 30. Therefore, when the organic antireflection film 30 is to be etched by plasma etching by using an oxygen-based gas as a plasma etching gas and the resist layer as a mask, the resist layer R may also etched in an isotropic manner. However, by using a mixture of a chlorinebased gas and an oxygen-based gas as a plasma etching gas, chlorine ions in the plasma react with carbon constituting the resist layer R and the organic antireflection film 30, so that a reaction product is formed and adsorbed on the surface of the resist layer R. The adsorbed reaction product functions as a protection film during etching. Hereinafter, the reaction product adsorbed on the sidewalls of the resist layer R is called the "protection film". The reaction product adsorbed on the upper part of the resist layer R is etched by collisions of ions in the plasma during etching. The formation of the protection film balances with the etching by oxygen ions and oxygen radicals in the plasma, so that the etching of the resist layer R in the lateral direction does not proceed. Consequently, by using a mixture of a chlorine-based gas and an oxygen-based gas as an etching gas, the resist layer is not substantially etched and only the organic antireflection film 30 can be selectively etched.

When an etching gas is a mixture of a chlorine-based gas and an oxygen-based gas, the mole ratio (number of chlorine atoms/number of oxygen atoms) is preferably 0.5 to 5, and more preferably 1 to 3. When the mole ratio is less than 0.5, the plasma is rich with oxygen ions and oxygen radicals, and an etching amount becomes greater than that of a protection film formed by a reaction product between chlorine and carbon, so that dimensions of the resist mask tends to be thin. For easily etching the organic antireflection layer, oxygen ions and oxygen radicals are made to readily advance toward the substrate, and not toward the side wall of the resist. That is, by applying a bias voltage on the substrate during etching, oxygen ions are attracted in the vertical direction about the surface of the substrate on which the resist layer is formed. By the influence of ions such as oxygen ions attracted, oxygen radicals are also attracted in the vertical direction about the surface of the substrate on which the resist layer is formed. Hence, an etching rate of the organic antireflection film 30 is greater than that at the sidewall of the resist layer R. Accordingly, a mole ratio not less than 0.5 is preferred. In contrast, when the mole ratio is greater than 5, the plasma is rich with chlorine ions, which is the opposite of the condition described above, the protection film formed on the side walls of the resist layer becomes too thick, and the width thereof becomes thick, so that it may be difficult to form gate electrodes having desired dimensions.

The selectivity ratio of the organic antireflection film 30 to the stop layer 28 (etching rate of the organic antireflection film/etching rate of the stop layer) within the range of the gas mixture described above is not limited so long as the stop layer 28 performs its proper function; the selectivity ratio is preferably not less than 5, and more preferably not less than 10. Since the selectivity ratio is not less than 5, even when the organic antireflection film 30 is overetched, performance of the function of the stop layer 28 is ensured. That is, when the organic antireflection film 30 is overetched, the stop layer 28 is not completely removed in a thickness direction, so that exposure of the polysilicon layer 26 is prevented. Consequently, when the selectivity ratio is greater than 5, the function of a gas mixture preventing the polysilicon layer 26 from contacting the etching gas is surely obtained.

When a gas mixture of an oxygen-based gas and a chlorine-based gas is used as the plasma etching gas, various other gases may be added to the gas mixture described above.

The additives may include, for example, argon, helium, and nitrogen. These additives are used for improving the plasma stability and for suppressing a problem of difference between dense and sparse of a resist pattern.

Preferable etching pressure is 1 to 10 mTorr, and more preferably 3 to 6 mTorr. When the etching pressure is less than 1 mTorr, plasma stability is difficult to maintain. In contrast, when the etching pressure is greater than 10 mTorr, isotropic plasma etching becomes dominant, side wall of the resist layer becomes too thick, and the width of the resist layer changes, so that it may be difficult to form gate electrodes having desired dimensions.

The etching method for the organic antireflection film 30 is not limited to high density plasma etching, and known dry etching methods and the like may also be employed.

Figure 4:
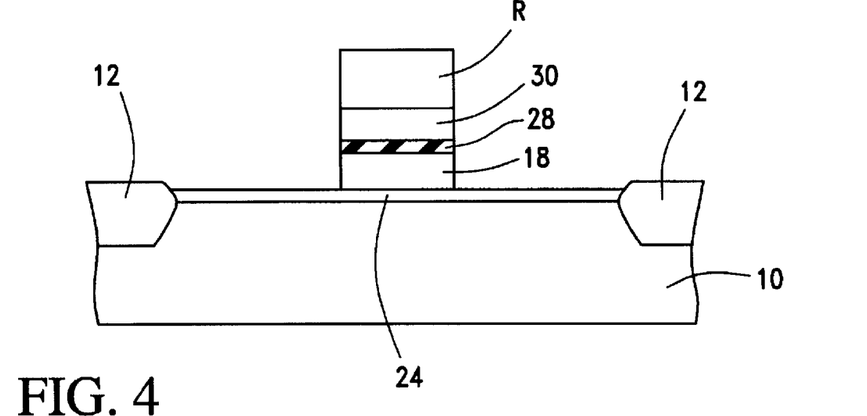
FIG. 4 is a schematic cross-sectional view showing a step of a manufacturing method for a semiconductor device according to an embodiment.

Referring to FIG. 4, an explanation will be made. First, the stop layer 28 is etched. When the organic antireflection film 30 is etched by high density plasma etching as described above, the stop layer 28 can be etched continuously by high density plasma etching with the same equipment by replacing an etching gas with a fluorinated gas such as a fluorocarbon. A fluorocarbon may be, for example, $CF_4$, $C_2F_6$, $CHF_3$, or $CH_2F_2$.

In the etching step for the stop layer 28, changes in the shape of the resist layer R is preferably minimized as much as possible. Accordingly, the stop layer 28 is preferably thin, since the etching is completed within a short period of time. A thickness not greater than 100 angstroms (10 nm) is preferable.

Next, the polysilicon layer 26 is etched. The etching method is preferably performed so as not to etch the gate oxide 24. Known etching methods, such as reactive ion etching, which use oxygen and hydrogen bromide as etching gases, can be employed. By this step, the polysilicon layer 26 is patterned and the gate electrode 18 is formed.

Every etching described above, that is, the etching of the organic antireflection film 30, the stopper 28, and the polysilicon layer 26, may be performed by high density plasma etching, and may be performed continuously with the same equipment by replacing the etching gas at each etching step.

Figure 5:
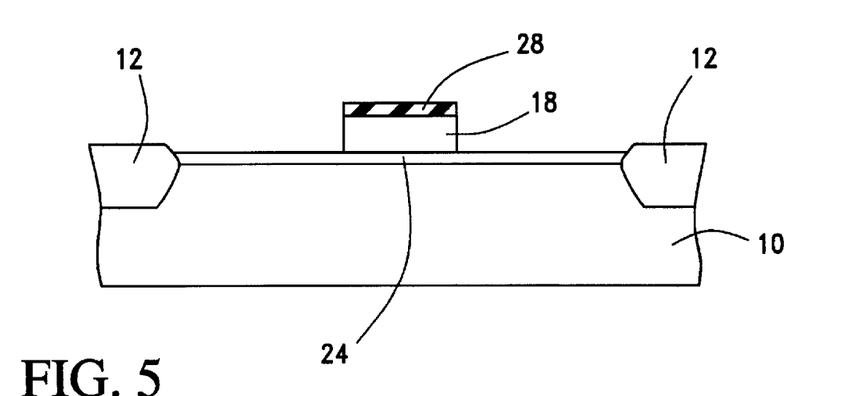
FIG. 5 is a schematic cross-sectional view showing a step of a manufacturing method for a semiconductor device according to an embodiment.

Next, as shown in FIG. 5, the organic antireflection film 30 and the resist layer R on the stop layer are removed, for example, by an ashing method utilizing, for example, oxygen.

Figure 6:
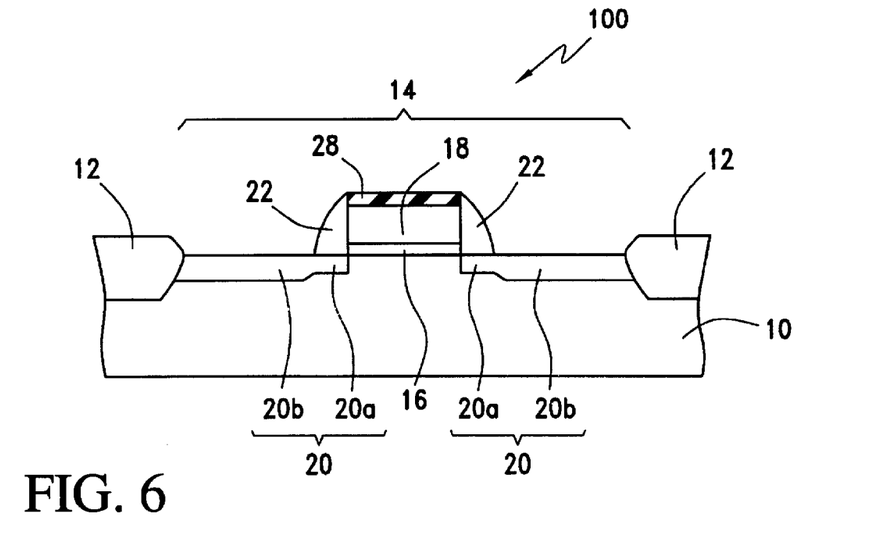
FIG. 6 is a schematic cross-sectional view showing a step of a manufacturing method for a semiconductor device according to an embodiment.

With reference to FIG. 6, an explanation will be made. First, a lightly doped n-type diffusion layer 20a, which includes source/drain regions, is formed by ion implantation of phosphorus or the like into a desired region of a p-type silicon substrate by using a photoresist mask.

Next, sidewall dielectric films are formed on both sides of the gate electrode, as explained below. A dielectric film (not shown) such as silicon oxide, silicon nitride, or the like is formed on a front surface by a method such as CVD. Then, the sidewall dielectric films are formed by etching the dielectric layer in an anisotropic manner by a method such as reactive ion etching.

A heavily doped n-type diffusion layer 20b is formed by ion implantation of an impurity such as arsenic into the p-type silicon substrate by using the gate electrode and the sidewall dielectric films as masks. By this step, a n-type dopant diffusion layer 20 having a lightly doped drain (LDD) structure is formed. Thus, MOS element 14 in the element region defined by the element isolation region 12 is formed, and the semiconductor device 100 according to the embodiment is complete.

A schematic cross-sectional view of the semiconductor device 100 is shown in FIG. 6. The semiconductor device 100 includes an element isolation region 12 and an n-type MOS element.

The element isolation region 12 is formed for isolating elements from each other and for defining an element region. The MOS element 14 includes a gate oxide film 16, a gate electrode 18, and an n-type dopant diffusion layer 20.

The gate oxide film 16 is formed on a p-type silicon substrate 10. The gate electrode 18 is disposed on the gate oxide film 16. The gate electrode 18 is composed of a polysilicon layer, in which an impurity is doped. Moreover, a stop layer 28 is formed on the gate electrode 18. Sidewall dielectric films 22 are formed so as to cover the gate oxide film 16, the gate electrode 18, and sidewalls of the stop layer 28.

The n-type dopant diffusion layer 20 includes source/drain regions. The n-type dopant diffusion layer 20 is composed of a lightly doped diffusion layer 20a and a heavily doped diffusion layer 20b, and forms an LDD structure.

Two features of the semiconductor device 100 according to one preferred embodiment are as described below.

The first is to etch the organic antireflection film 30 by using the etching gas including at least one of an oxygen-based gas and a chlorine-based gas. The etching gas generates the reaction product by reacting carbons constituting the resist layer R and the organic antireflection film 30 with chlorine ions in plasma, which is incorporated in chlorine-based gas. The reaction product is adsorbed on the surface of the resist layer R, and then the protection film of the reaction product is formed on the side walls of the resist layer R. The formation of the protection film balances with the etching caused by oxygen ions in plasma, so that the etching of the resist layer R in the lateral direction thereof does not proceed. Consequently, the organic antireflection film 30 can be etched without changing dimensions of the resist layer R.

The second is to etch the organic antireflection film 30 by disposing the stop layer 28 between the organic antireflection film 30 and the polysilicon layer 26. The stop layer 28 has a function of preventing the polysilicon layer 26 from contacting the etching gas when the organic antireflection film 30 is etched. Therefore, when the organic antireflection film 30 is etched, etching defects generated in the form of pin holes on the upper part of the polysilicon layer 26 adjacent to the resist layer R can be inhibited. Consequently, a fine gate electrode structure having no defects such as perforation in the gate oxide film 16 can be obtained.

Next, an alternative embodiment of a method for manufacturing a semiconductor device of the embodiment will be explained. The manufacturing method in the alternative embodiment differs from that of the above embodiment in that no stop layer is formed in the alternative embodiment. Hereinafter, the alternative embodiment will be explained in detail.

Figure 7:
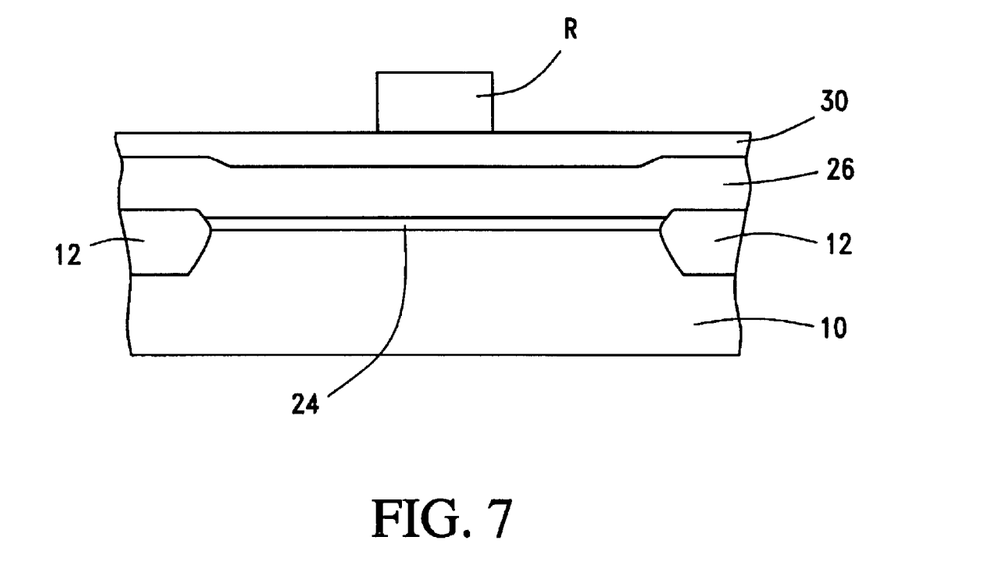
FIG. 7 is a schematic cross-sectional view showing a step of a manufacturing method for a semiconductor device according to an embodiment.

An explanation will be made with reference to FIG. 7. Similar to the above embodiment, an element isolation region 12 and an oxide film 24 are formed on a substrate 10, and a polysilicon layer 26 is formed on the element isolation region 12 and the oxide layer 24. An organic antireflection layer 30 is formed on the polysilicon layer 26 without forming a stop layer. Then, a resist layer R patterned by a predetermined pattern is formed on the organic antireflection layer 30. A description of subsequent steps are omitted because they are equivalent to the method for manufacturing the semiconductor device in the previous embodiment. The modified embodiment has the first feature of the method for manufacturing the semiconductor device in the previous embodiment, and certain advantages are because of this feature.

Figure 8:
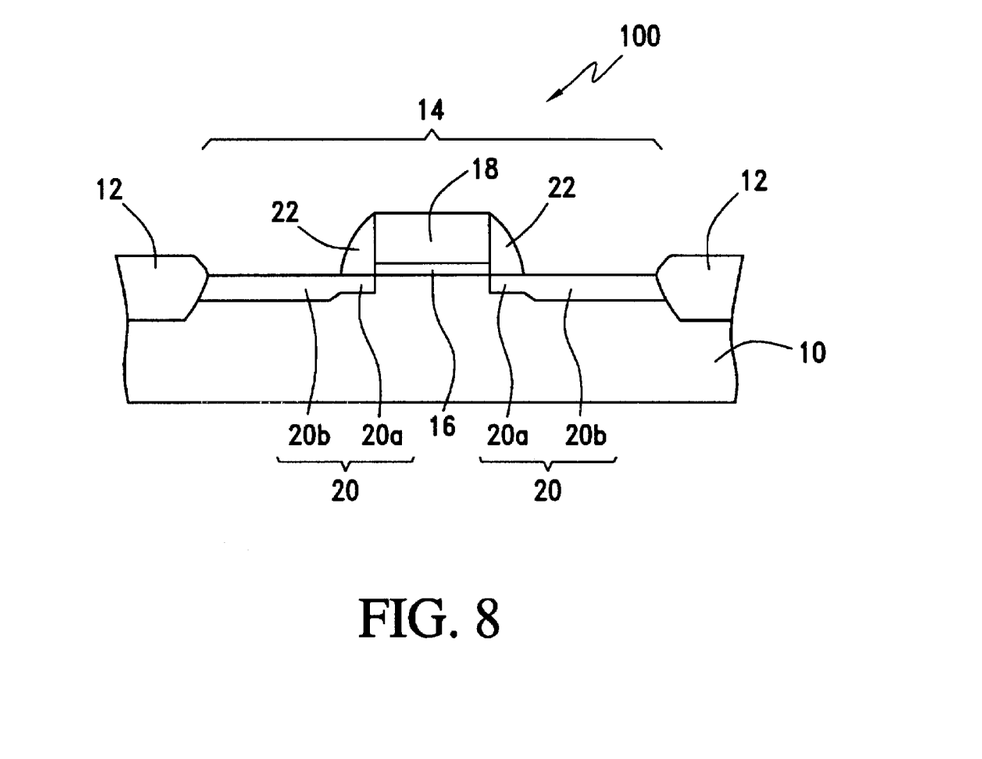
FIG. 8 is a schematic cross-sectional view showing a step of a manufacturing method for a semiconductor device according to an embodiment.

A semiconductor device obtained by the method for manufacturing the semiconductor device in the modified embodiment is shown in FIG. 8. The semiconductor device of the modified embodiment differs from that of the embodiment in that no stop layer is formed in the modified embodiment.

When the relationship between critical dimension (CD) shift amount and etching pressure in the organic antireflection layer etching was measured, the following information was obtained. The CD shift amount is the length of the dimension of a predetermined part of a resist layer formed in a photolithographic step minus the dimension of the same part thereof after etching an organic antireflection film. The etching was performed in an etching apparatus having a high density plasma source. Etching gas composed of chlorine and oxygen was used, in which the ratio of the flow volume of chlorine to that of oxygen was 1:1.

Figure 9:
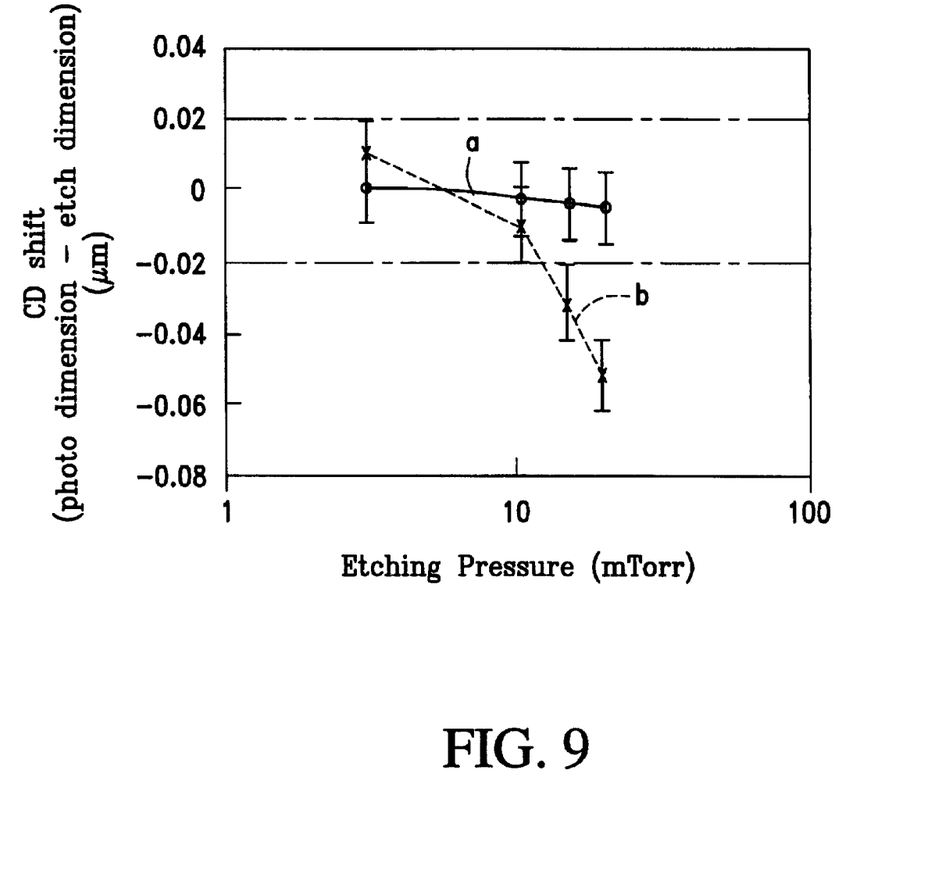
FIG. 9 is a graph showing the relationship between the CD shift amount and the etching pressure.

FIG. 9 is a graph showing the relationship between CD shift amount and etching pressure. A solid line (symbol "a") shows an experimental result obtained at a part (a dense part) where the resist layer having sections 0.25 μm wide at a spacing of 0.25μm are repeatedly formed. A dotted line (symbol "b") shows an experimental result at a part (a sparse part) where a resist layer having sections 0.25μm wide at a spacing of 30μm are repeatedly formed.

From FIG. 9, at a dense part, the CD shift amount was not significantly influenced by etching pressure. In contrast, the CD shift amount decreased as etching pressure increased at a sparse part, and it is understood that the CD shift amount at the sparse part is greatly influenced by the etching pressure comparing to the dense part.

At present, a CD shift amount is believed to be preferably within the range between −10% to +10% of a width of the resist layer. From FIG. 9, to have a CD shift amount within the range mentioned above, regardless of patterns of the resist layer, it is appreciated that etching pressure is preferably not greater than 10 mTorr.

In the above example, the stop layer remained on the gate electrode; however, if necessary, the stop layer can be removed.

The example described above can be modified within the scope of the present invention, for example, it can be applied to a p-type MOS. A variety of materials may be used for the various layers. For example, the material for the gate electrode is not limited to polysilicon, and an intermetallic compound of silicon may be applied to the gate electrode.

What is claimed:

1. A method for manufacturing a semiconductor device, comprising:

forming a dielectric film on a semiconductor substrate;

forming a conductive film containing silicon on the dielectric film;

forming an organic antireflection film on the conductive film;

forming a resist layer having a predetermined pattern on the organic antireflection film;

etching the organic antireflection film by using the resist layer as a mask, using an etching gas mixture comprising an oxygen-based gas and a chlorine-based gas, wherein the etching is carried out at an etching pressure of 1 to 10 mTorr, and wherein the etching is carried out using a high density plasma having an ion density of not less than $1 \times 10^{11}$ cm$^{-3}$; and forming a gate electrode by etching the conductive film with a predetermined pattern.

2. A method for manufacturing a semiconductor device according to claim 1, wherein the organic antireflection film is a film comprising an organic material as a main component and having a light reflectance of not more than 5% for a predetermined wavelength.

3. A method for manufacturing a semiconductor device according to claim 1, wherein a ratio of the number of chlorine atoms to the number of oxygen atoms in the etching gas is 0.5 to 5.

4. A method for manufacturing a semiconductor device according to claim 1, wherein the chlorine-based gas includes at least one gas selected from the group consisting of $Cl_2$, $CCl_4$, HCl, and $BCl_3$.

5. A method for manufacturing a semiconductor device according to claim 1, wherein the oxygen-based gas includes at least one gas from the group consisting of oxygen, ozone, and carbon monoxide.

6. A method for manufacturing a semiconductor device according to claim,1, wherein the etching gas further includes at least one selected from the group consisting of argon, helium, and nitrogen.

7. A method for manufacturing a semiconductor device according to claim 1, wherein the etching gas mixture includes a ratio of the flow volume of chlorine to oxygen of 1 to 1.

8. A method for manufacturing a semiconductor device according to claim 1, wherein the etching the organic antireflection film by using the resist layer as a mask, using an etching gas, is carried out at an etching pressure of 1 to 10 mTorr.

9. A method for manufacturing a semiconductor device according to claim 1, wherein etching the organic antireflection film by using the resist layer as a mask, using an etching gas, and forming a gate electrode by etching the conductive layer with a predetermined pattern, are performed continuously.

10. A method as in claim 1, wherein the etching the organic antireflection film is carried out at a pressure of 3 to 6 mTorr.

11. A method for fabricating a semiconductor device, comprising:

forming a dielectric film on a semiconductor substrate;

forming a conductive film on the dielectric film;

forming an organic antireflection film on the conductive film;

forming a resist layer having a predetermined pattern on the organic antireflection film; etcthing the organic antireflection film by using the resist layer as a mask using an etchig gas comprising an oxygen-based gas and a chlorine-based gas, the etching being carried out using a high density plasma having an ion density of at least $1 \times 10^{11}$ cm$^{-3}$;

etching the conductive layer; and removing the resist layer and any organic antireflection film remaining after the etching the organic antireflection film.

12. A method as in claim 11, wherein the conductive layer is etched with a predetermined pattern to form a gate electrode.

13. A method as in claim 11, wherein a ratio of the number of chlorine atoms to the number of oxygen atoms in the etching gas is 0.5 to 5.

14. A method as in claim 11, wherein the gas used to etch the antireflection film further comprises at least one gas selected from the group consisting of argon, helium and nitrogen.

15. A method as in claim 12, wherein after the etching of the conductive layer, the conductive layer includes side surfaces, the method further comprising:

forming a lightly doped diffusion layer in the substrate;

forming a sidewall dielectric film at the side surfaces of the conductive layer; and forming a heavily doped diffusion layer in the substrate using the gate electrode and the sidewall dielectric film at the side surface of the conductive layer as a mask.

16. A method as in claim 15, wherein the etching is carried out at a pressure of 1 to 10 mTorr.

17. A method as in claim 11, wherein the etching the organic antireflection film is carried out at a pressure of 3 to 6 mTorr.

18. A method for fabricating a semiconductor device including a gate electrode, comprising:

forming a conductive film containing silicon over a dielectric layer;

forming an organic antireflection film on the conductive film;

forming a resist layer having a predetermined pattern on the organic antireflection film;

etching the organic antireflection film by using the resist layer as a mask, using an etching gas comprising an oxygen-based gas and a chlorinebased gas, the etching being carried out using a high density plasma having an ion density of at least $1 \times 10^{11}$ cm$^{-3}$, the etching being carried out at a pressure of 1 to 10 mTorr; and etching the conductive layer to form a gate electrode.

19. A method as in claim 18, wherein a ratio of the number of chlorine atoms to the number of oxygen atoms in the etching gas is 0.5 to 5.

20. A method as in claim 18, wherein the etching the organic antireflection film is carried out at a pressure of 3 to 6 mTorr.

* * * * *